(12) United States Patent
Lai

(10) Patent No.: US 6,927,087 B2
(45) Date of Patent: Aug. 9, 2005

(54) ACTIVE MATRIX SUBSTRATE FOR A LIQUID CRYSTAL DISPLAY AND METHOD OF FORMING THE SAME

(75) Inventor: Han-Chung Lai, Jungli (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/919,838

(22) Filed: Aug. 16, 2004

(65) Prior Publication Data

US 2005/0019970 A1 Jan. 27, 2005

Related U.S. Application Data

(62) Division of application No. 10/438,417, filed on May 13, 2003, now Pat. No. 6,825,497.

(30) Foreign Application Priority Data

May 15, 2002 (TW) .......................................... 91110141 A

(51) Int. Cl.[7] ............................................. H01L 21/00
(52) U.S. Cl. .............................. 438/29; 438/30; 438/48; 438/49; 438/54; 438/128; 438/149; 438/151; 438/157; 438/166; 438/283
(58) Field of Search ............................... 438/48–49, 54, 438/128, 149, 151, 157, 166, 283, 29–30

(56) References Cited

U.S. PATENT DOCUMENTS

| | | | | |
|---|---|---|---|---|
| 5,260,818 A | * | 11/1993 | Wu ............................. 349/55 |
| 5,414,547 A | * | 5/1995 | Matsuo et al. ................ 349/44 |
| 5,459,595 A | * | 10/1995 | Ishiguro et al. ............. 349/111 |
| 5,478,766 A | | 12/1995 | Park et al. .................... 437/40 |
| 5,519,521 A | * | 5/1996 | Okimoto et al. ............... 349/42 |
| 5,641,974 A | | 6/1997 | den Boer et al. ............. 257/59 |
| 5,650,637 A | * | 7/1997 | Kodaira et al. ................ 257/72 |
| 5,668,650 A | * | 9/1997 | Mori et al. .................... 349/42 |
| 5,744,821 A | | 4/1998 | Song ............................ 257/59 |
| 5,780,871 A | | 7/1998 | den Boer et al. ............. 257/59 |
| 5,811,318 A | | 9/1998 | Kweon ......................... 438/30 |
| 5,854,663 A | | 12/1998 | Oh et al. ...................... 349/42 |
| 5,872,370 A | | 2/1999 | Gu et al. ...................... 257/66 |
| 5,917,199 A | | 6/1999 | Byun et al. ................... 257/59 |
| 5,942,310 A | | 8/1999 | Moon ...................... 428/195.1 |
| 5,955,744 A | | 9/1999 | Gu et al. ...................... 257/59 |
| 6,243,146 B1 | | 6/2001 | Rho et al. ..................... 349/42 |
| 6,294,796 B1 | | 9/2001 | Mano et al. .................. 257/59 |
| 6,380,559 B1 | | 4/2002 | Park et al. .................... 257/59 |
| 6,825,497 B2 | * | 11/2004 | Lai .............................. 257/72 |
| 6,842,201 B2 | * | 1/2005 | Lai .............................. 349/43 |
| 2001/0017371 A1 | | 8/2001 | Tanaka et al. ................ 257/59 |
| 2002/0190253 A1 | | 12/2002 | Tsujimuru et al. ............ 257/59 |
| 2003/0210356 A1 | * | 11/2003 | Lai .............................. 349/43 |

* cited by examiner

Primary Examiner—Amir Zarabian
Assistant Examiner—Ida M. Soward
(74) Attorney, Agent, or Firm—Ladas & Parry LLP

(57) ABSTRACT

An active matrix substrate for a liquid crystal display and method of forming the same. To form the active matrix substrate five masks are needed. The first mask forms gate lines on the transparent substrate. The second mask patterns a stacked layer of a metal layer/an n-doped layer/a semiconductor layer formed on a gate insulating layer to form data lines. After forming a low k dielectric layer, the third mask forms openings therein. The forth mask patterns pixel electrodes and conducting lines with source pattern on the low k dielectric layer and further patterns the metal layer and the n-doped layer. After depositing a passivating layer the fifth mask defines the passivating layer.

7 Claims, 12 Drawing Sheets

ACTIVE MATRIX SUBSTRATE FOR A LIQUID CRYSTAL DISPLAY AND METHOD OF FORMING THE SAME

CROSS-REFERENCE TO RELATED APPLICATIONS

This patent application is a divisional application of U.S. Ser. No. 10/438,417, filed on May 13, 2003 now U.S. Pat. No. 6,825,497, which claims priority to Taiwanese Application No. 91110141, filed on May 15, 2002.

BACKGROUND OF THE INVENTION

1. Field of the Invention

The present invention relates in general to an active matrix substrate for a liquid crystal display (LCD) and method of forming the same. In particular, the present invention relates to a liquid crystal display having a high pixel aperture ratio (pixel opening size) and method of forming the same.

2. Description of the Related Art

Generally, LCDs have an upper and a lower substrate with electrodes thereon. These substrates are sealed with adhesive materials, and a liquid crystal material is sealed between these two substrates. Before the liquid crystal is injected between the two substrates, spacers are sprayed between the substrates in order to hold a constant distance therebetween. Conventionally, many TFTs are formed above the lower substrate as switching devices. Each TFT has a gate electrode connected to a scanning line, a drain electrode connected with a signal line, and a source electrode connected to a pixel electrode. The lower substrate is also called an active matrix substrate. The upper substrate includes a color filter and a common electrode.

The higher the pixel aperture ratio of a LCD, the higher the display transmission. Thus, by increasing the pixel aperture ratio of a LCD, transmission may be increased using the same backlight power, or alternatively, the backlight power consumption may be reduced while maintaining the same display transmission.

In order to enhance the pixel aperture ratio, a thicker insulating layer is formed over source and drain electrodes before forming pixel electrodes, thus, the pixel electrodes are formed over the insulating layer so as to overlap portions of the address lines, as disclosed in U.S. Pat. Nos. 5,955,744, 5,780,871, 5,641,974. Thus, the capacitance between pixel electrodes and underlying conducting material can be reduced, and an effective display area, i.e. the area of the pixel electrode, can be enlarged.

SUMMARY OF THE INVENTION

It is an object of the present invention to provide a method of forming an active matrix substrate for a liquid crystal display with a high pixel aperture ratio and method of forming the same.

According to one aspect of the invention, an active matrix substrate for a liquid crystal display is provided. A plurality of gate lines are disposed on a transparent substrate, parallel to a first direction and with protruding portions covering active device regions. A gate insulating layer is disposed on the gate lines and the transparent substrate. A low k dielectric layer is disposed on the gate insulating layer, and has first openings corresponding to the active device regions. A plurality of data lines are disposed between the low k dielectric layer and the gate insulating layer, perpendicular to the first direction and with protruding portions covering the active device regions. The data lines and the gate lines define regions including the active device regions and the pixel regions. A first n-doped layer is disposed under the data lines, contacts the data lines and has the same pattern as a gathering of the data lines, wherein the first n-doped layer at one side of the first openings providing sources. Conducting lines with source pattern are disposed at the first openings on the sources, with the protruding portions of the data lines contact source electrodes. Second n-doped layer is disposed under the data lines, and contacts the drain electrodes belonging to the protruding portions of the data lines, wherein the second n-doped layer at the other side of the first openings provides drains. A channel exists between each source and its corresponding drain. A semiconductor layer is disposed under the first n-doped layer and the second n-doped layer on the gate insulating layer and has the same pattern as a gathering of the first n-doped layer, the second n-doped layer and the channels. Pixel electrodes are disposed on the low k dielectric layer at the pixel regions and contact the drains. A passivating layer is disposed on the first openings.

According to another aspect of the invention, an active matrix substrate for a liquid crystal display can be formed by the following steps. Gate lines are formed on the transparent substrate, parallel to a first direction and with protruding portions covering a plurality of active device regions. A gate insulating layer is formed on the gate lines and the transparent substrate. A semiconductor layer is formed on the gate insulating layer. An n-doped layer is formed on the semiconductor layer. A metal layer is formed on the n-doped layer. The semiconductor layer, the n-doped layer and the metal layer are patterned and the metal layer is transferred to data lines perpendicular to the first direction. A low k dielectric layer is formed on the transparent substrate having the data lines thereon. First openings are formed in the low k dielectric layer corresponding to the active device regions. A transparent conducting layer is formed on the low k dielectric layer. The transparent conducting layer is patterned to pixel electrodes and conducting lines with source pattern. The data lines and the n-doped layer corresponding to the first openings are etched, so the data lines and the n-doped layer have the same local pattern as the pixel electrodes and the conducting lines in the first openings. A passivating layer is formed on the first openings.

To form the active matrix substrate five masks are needed. The first mask forms gate lines on the transparent substrate. The second mask patterns a stacked layer of a metal layer/an n-doped layer/a semiconductor layer formed on a gate insulating layer to form data lines. After forming a low k dielectric layer, the third mask forms openings therein. The forth mask patterns pixel electrodes and conducting lines with source pattern on the low k dielectric layer and further patterns the metal layer and the n-doped layer. After depositing a passivating layer the fifth mask defines the passivating layer.

BRIEF DESCRIPTION OF THE DRAWINGS

The present invention will become more fully understood from the detailed description given herein below and the accompanying drawings, given by way of illustration only and thus not intended to be limitative of the present invention.

FIGS. 2A–2E are cross sections showing the manufacturing steps in fabricating an active matrix substrate for a liquid crystal display in accordance with the present invention, wherein FIGS. 2A–2D are cross sections taken along line II—II of FIGS. 1A–1D respectively.

FIGS. 7A–7E are cross sections showing the manufacturing steps in fabricating an active matrix substrate for a liquid crystal display in accordance with the present invention, wherein FIGS. 7A–7D are cross sections taken along line II—II of FIGS. 1A–1D respectively.

DETAILED DESCRIPTION OF THE INVENTION

Figure 1A:
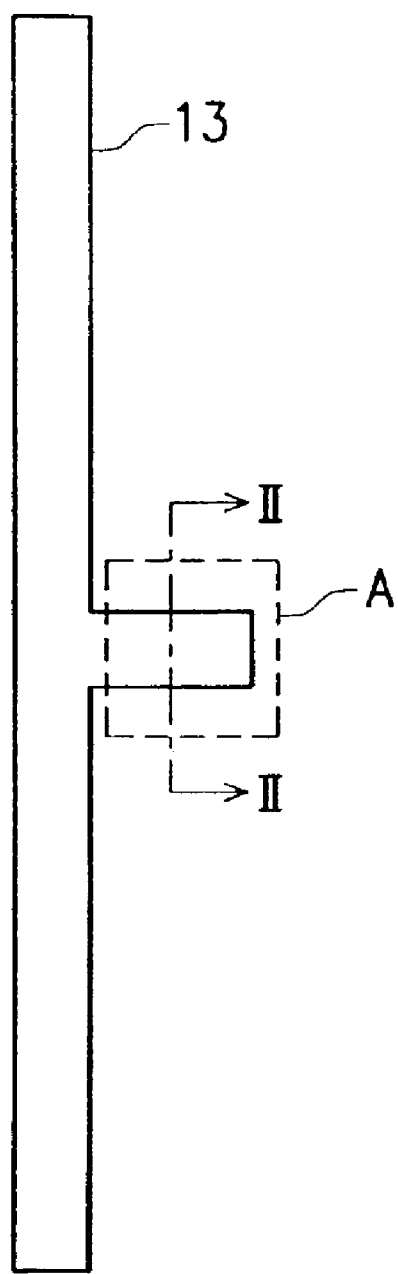
FIGS. 1A–1D are a series of layouts of the active matrix substrate showing the manufacturing steps in fabricating an active matrix substrate for a liquid crystal display in accordance with the first embodiment of the present invention.
Figure 1B:
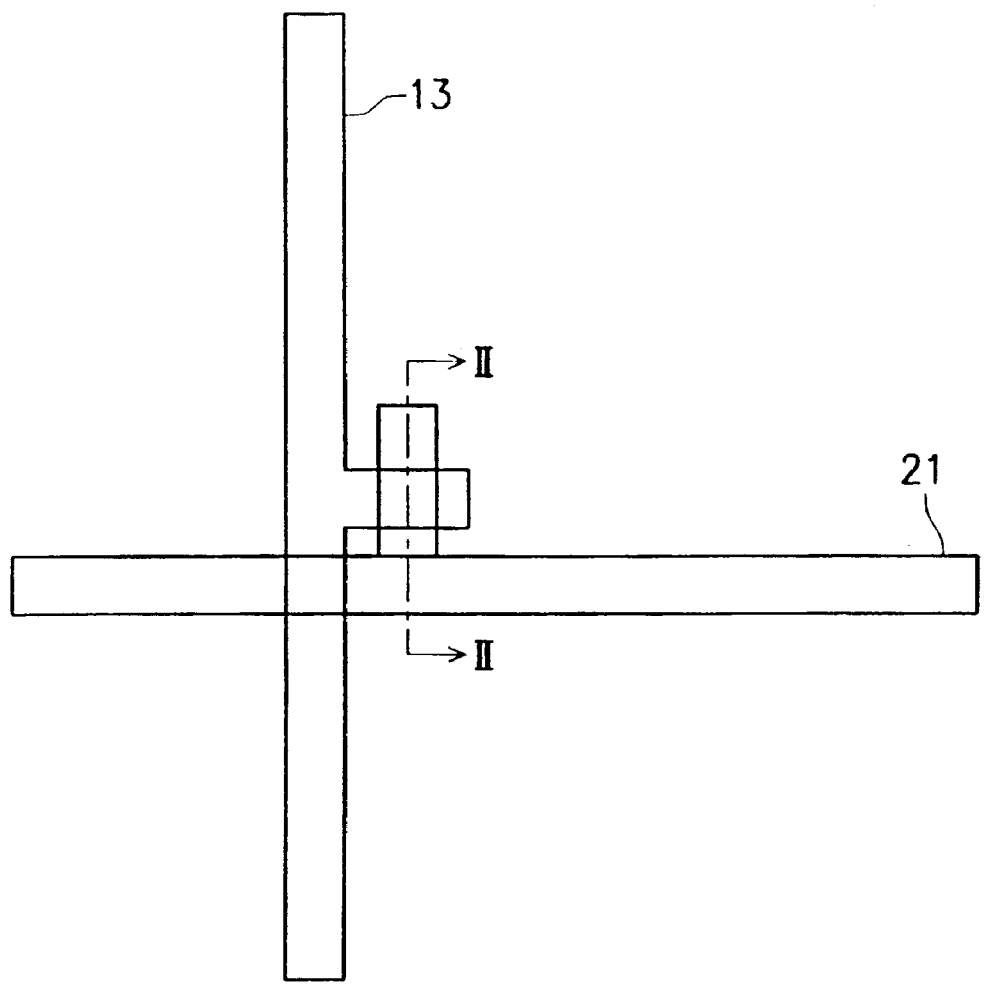
Figure 1C:
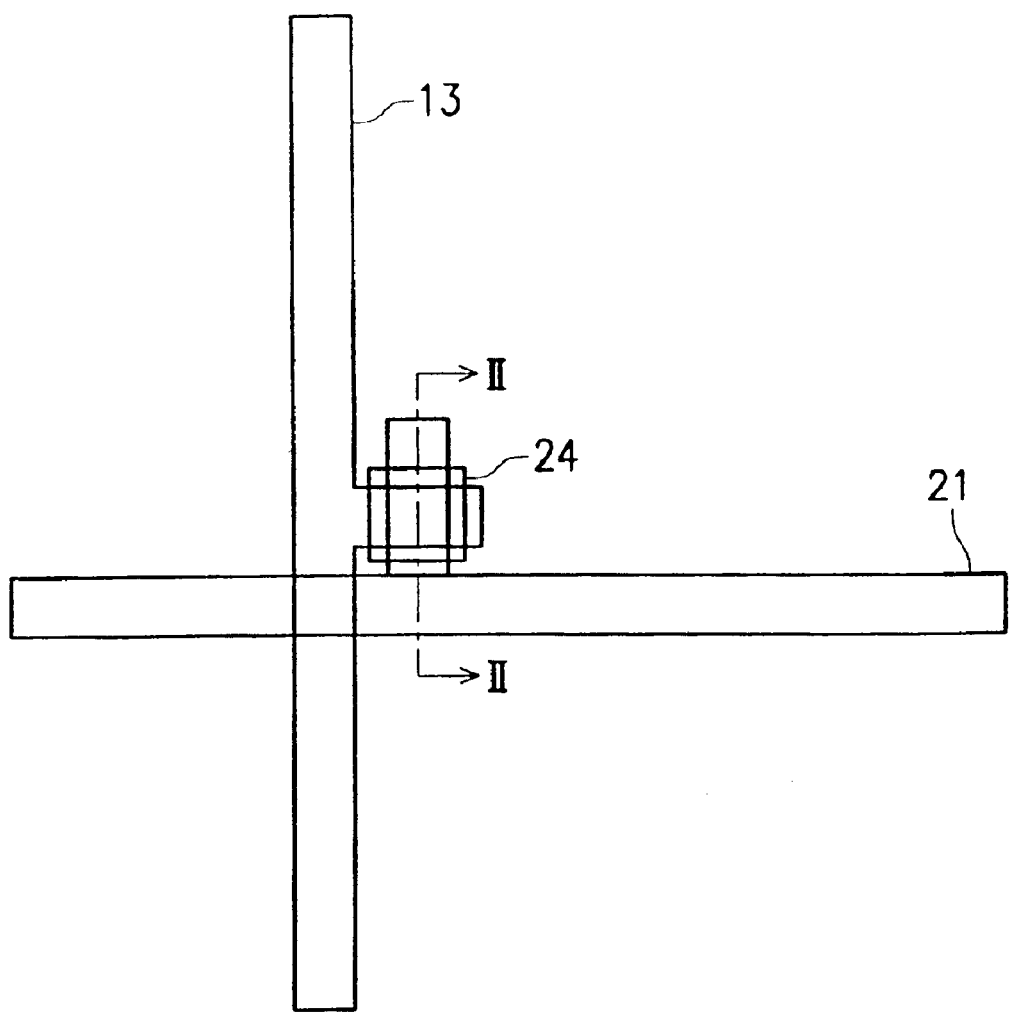
Figure 1D:
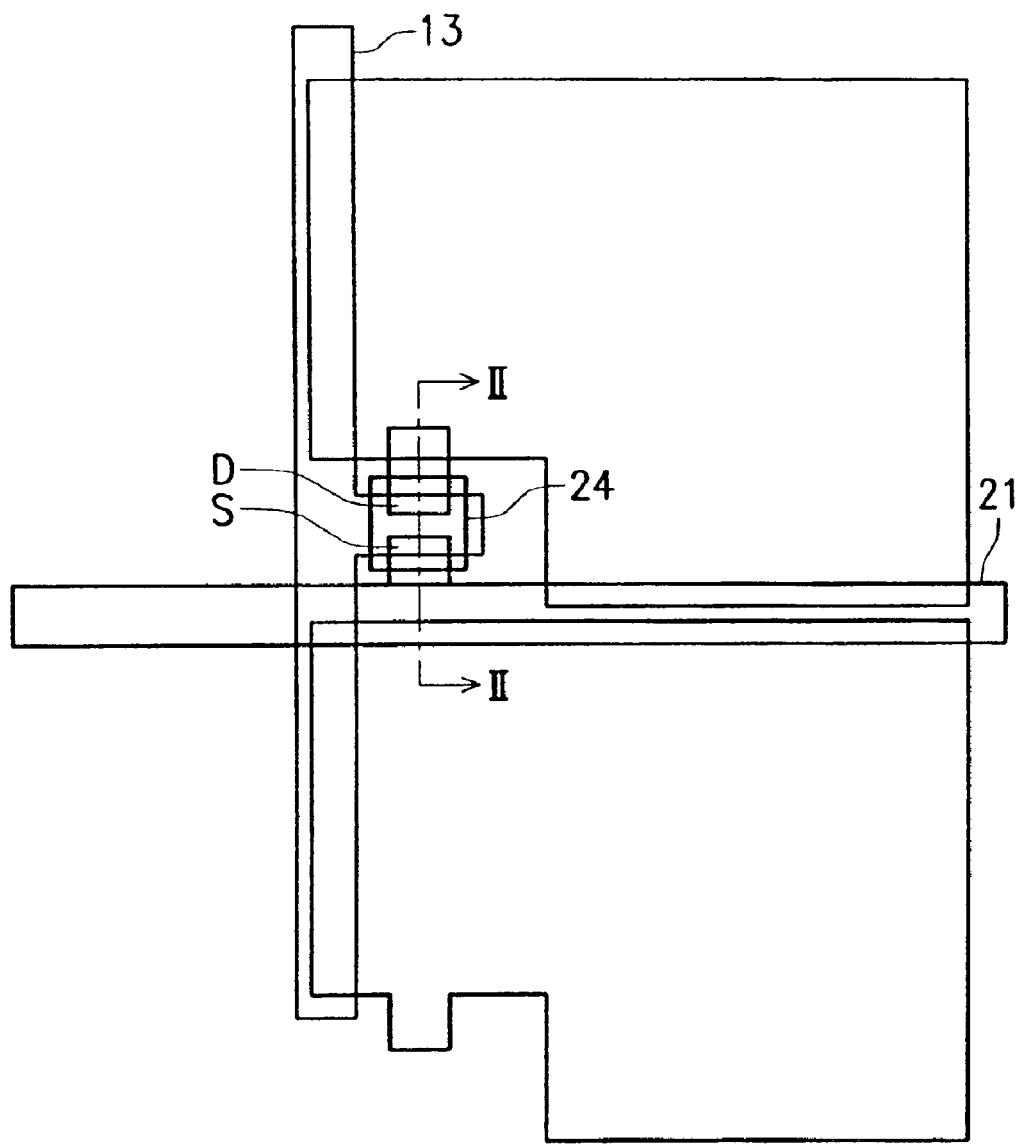
Figure 2A:
Figure 2B:
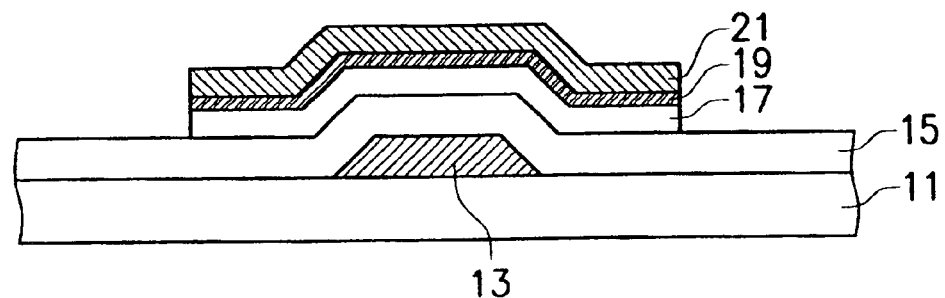
Figure 2C:
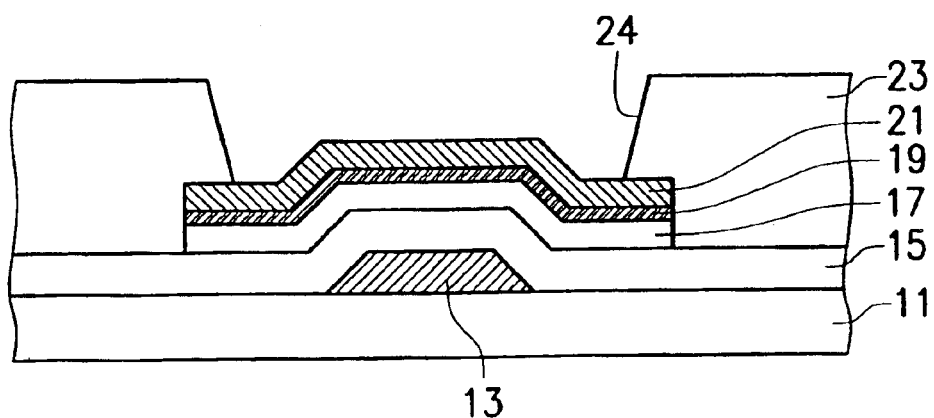
Figure 2D:
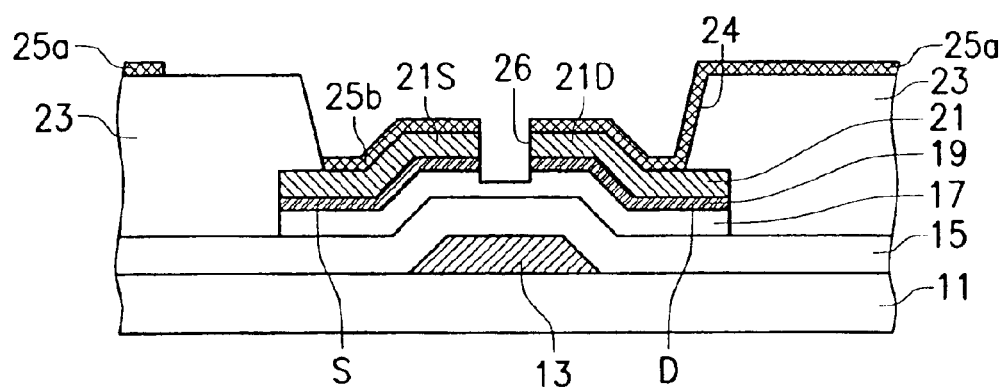
Figure 2E:
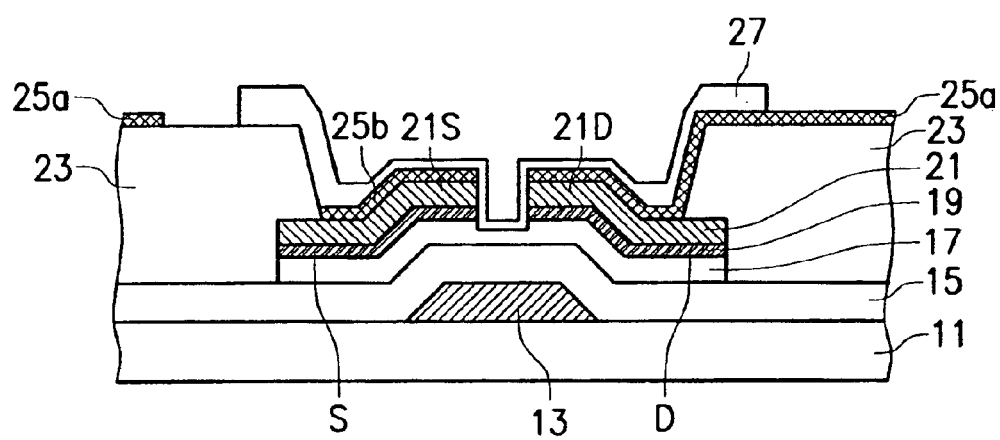

An active matrix substrate having a high pixel aperture ratio is shown in FIG. 1D and FIG. 2E. A detailed description of the active matrix substrate and method for forming the same is given in the following embodiments.

First Embodiment

FIGS. 2A–2E are cross sections showing the manufacturing steps in fabricating an active matrix substrate for a liquid crystal display in accordance with the first embodiment of the present invention. FIGS. 1A–1D are a series of layouts of the active matrix substrate of FIGS. 2A–2D respectively.

Referring to FIGS. 1A and 2A, a transparent substrate 11 is provided. A metal layer, such as Al or Al alloy, is formed on the transparent substrate 11. After defining the metal layer using lithography and etching, gate lines 13 are formed. The gate lines 13 have protruding portions covering active device regions A, and the protruding portions of the gate lines 13 function as gates for thin film transistors (TFTs). Each active device region A is located at a corner of each pixel region.

Referring to FIGS. 1B and 2B, a gate insulating layer 15 is formed on the gate lines 13 and the transparent substrate 11. A semiconductor layer, an n-doped layer and a metal layer are sequentially formed on the gate insulating layer 15. The insulating layer can be silicon nitride, the semiconductor layer can be amorphous silicon, and the metal layer can be Cr or Cr alloy. The metal layer/the n-doped layer/the semiconductor layer are etched by one photolithography and etching process to form data lines 21, a patterned n-doped layer 19 and a patterned semiconductor layer 17.

Referring to FIGS. 1C and 2C, a low k dielectric layer 23 is formed on the data lines 21 and the gate insulating layer 15. The low k dielectric layer 23 has a dielectric constant (k) less than 5 and with high transparency. Because the low k dielectric layer 23 can reduce the capacitance between the data and gate lines and the pixel electrodes to be formed, the pixel electrodes can be formed over the low k dielectric layer 23 to overlap portions of the data and gate lines to increase the pixel aperture ratio. The low k dielectric layer 23 can be photosensitive material or non-photosensitive material, such as benzocyclobutene (BCB). The thickness of the low k dielectric layer 23 is about 1–5 $\mu$m.

Openings 24 are then formed in the low k dielectric layer 23 and corresponding to the active device regions A.

Referring to FIGS. 1D and 2D, a transparent conducting layer, such as indium tin oxide (ITO), is formed on the low k dielectric layer 23. The transparent conducting layer, the data lines 21 and the n-doped layer 19 are etched, therefore, openings 24 are formed in the transparent conducting layer, the date lines 21 and the n-doped layer 19, sources S and drains D are defined in the n-doped layer 19, and the transparent conducting layer is transferred to pixel electrodes 25a and conducting lines 25b with source patterns. A channel exists in the semiconductor layer 17 between each source S and its corresponding drain D. Each source S contacts the corresponding source electrode 21S connecting to the corresponding conducting line 25b. Each drain D contacts the corresponding drain electrode 21D connecting to the corresponding pixel electrode 25a. The source electrodes 21S and the drain electrodes 21D belong to the protruding portions of the data lines 21.

Referring to FIG. 2E, a passivating layer 27, such as a silicon nitride layer, is formed on the conducting lines 25b, the channels and the pixel electrodes 25a at active device regions A to protect the channels between the sources S and the drains D.

After forming the passivating layer 27 the active matrix substrate is obtained. The following processes of fabricating upper substrate and filling liquid crystal therebetween follow.

Second Embodiment

FIGS. 7A–7E are cross sections showing the manufacturing steps in fabricating an active matrix substrate for a liquid crystal display in accordance with the second embodiment of the present invention. FIGS. 1A–1D are a series of layouts of the active matrix substrate of FIGS. 7A–7D respectively.

Figure 7A:

Referring to FIGS. 1A and 7A, a transparent substrate 11 is provided. A metal layer, such as Al or Al alloy, is formed on the transparent substrate 11. After defining the metal layer using lithography and etching, gate lines 13 are formed. The gate lines 13 have protruding portions covering active device regions A, and the protruding portions of the gate lines 13 function as gates for thin film transistors (TFTs). Each active device region A is located at a corner of each pixel region.

Figure 7B:
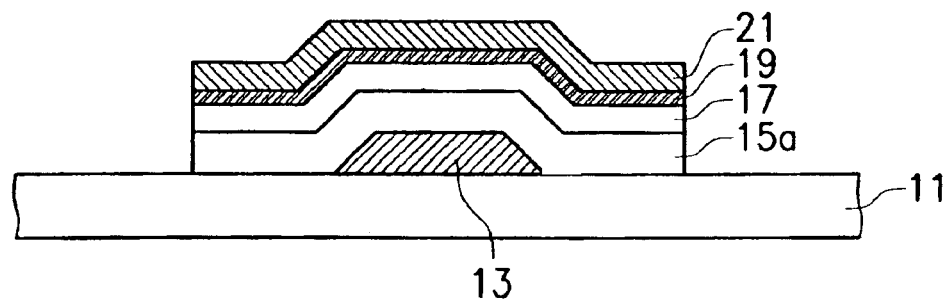

Referring to FIGS. 1B and 7B, a gate insulating layer, a semiconductor layer, an n-doped layer and a metal layer are sequentially formed on the gate lines 13 and the transparent substrate 11. The insulating layer can be silicon nitride, the semiconductor layer can be amorphous silicon, and the metal layer can be Cr or Cr alloy. The metal layer/the n-doped layer/the semiconductor layer/the gate insulating layer are etched by one photolithography and etching process to form data lines 21, a patterned n-doped layer 19, a patterned semiconductor layer 17 and a patterned gate insulating layer 15a.

Figure 7C:
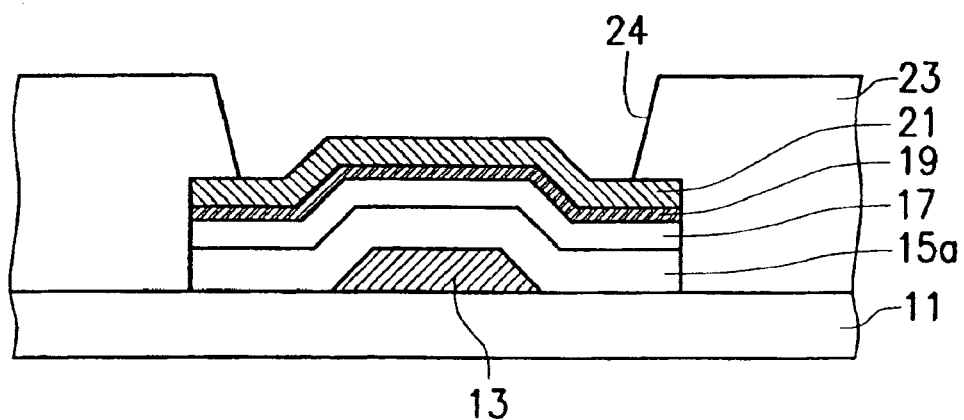

Referring to FIGS. 1C and 7C, a low k dielectric layer 23 is formed on the data lines 21 and the transparent substrate 11. The low k dielectric layer 23 has a dielectric constant (k) less than 5 and high transparency. Because the low k dielectric layer 23 can reduce the capacitance between the data and gate lines and the pixel electrodes to be formed, the pixel electrodes can be formed over the low k dielectric layer 23 to overlap portions of the data and gate lines to increase the pixel aperture ratio. The low k dielectric layer 23 can be photosensitive material or non-photosensitive material, such as benzocyclobutene (BCB). The thickness of the low k dielectric layer 23 is about 1–5 $\mu$m.

Openings 24 are then formed in the low k dielectric layer 23 and corresponding to the active device regions A.

Figure 7D:
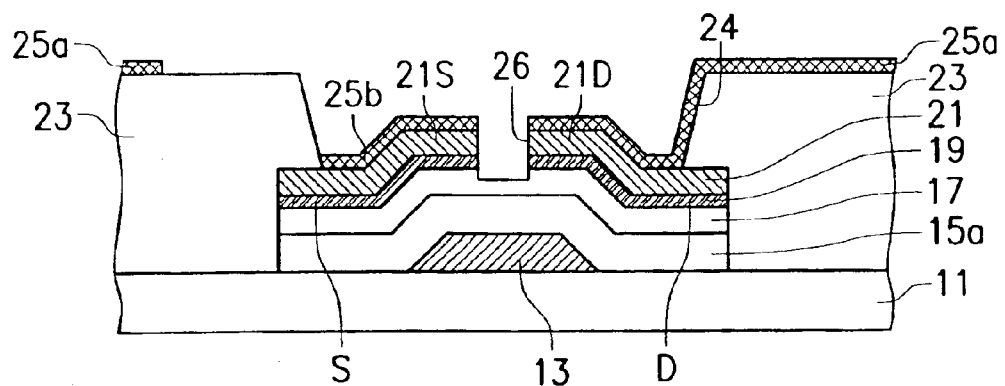

Referring to FIGS. 1D and 7D, a transparent conducting layer, such as indium tin oxide (ITO), is formed on the low k dielectric layer 23. The transparent conducting layer, the data lines 21 and the n-doped layer 19 are etched, therefore, openings 24 are formed in the transparent conducting layer, the date lines 21 and the n-doped layer 19, sources S and drains D are defined in the n-doped layer 19, and the transparent conducting layer is transferred to pixel electrodes 25a and conducting lines 25b with source patterns. A channel exists in the semiconductor layer 17 between each source S and its corresponding drain D. Each source S contacts the corresponding source electrode 21S connecting to the corresponding conducting line 25b. Each drain D contacts the corresponding drain electrode 21D connecting to the corresponding pixel electrode 25a.

Figure 7E:
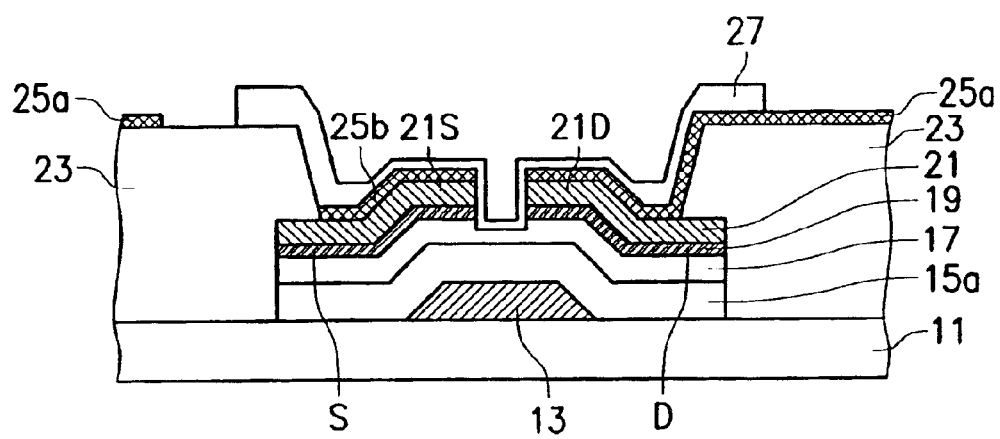

Referring to FIG. 7E, a passivating layer 27, such as a silicon nitride layer, is formed on the conducting lines 25b, the channels and the pixel electrodes 25a at active device regions A to protect the channels between the sources S and the drains D.

After forming the passivating layer 27 the active matrix substrate is obtained. The following processes of fabricating upper substrate and filling liquid crystal therebetween follow.

Third Embodiment

Concerning the fabrication of the electrostatic discharge (ESD) protection circuit, a detailed description is given below accompanying FIGS. 3–4, 5A, 5B and 6.

Figure 3:
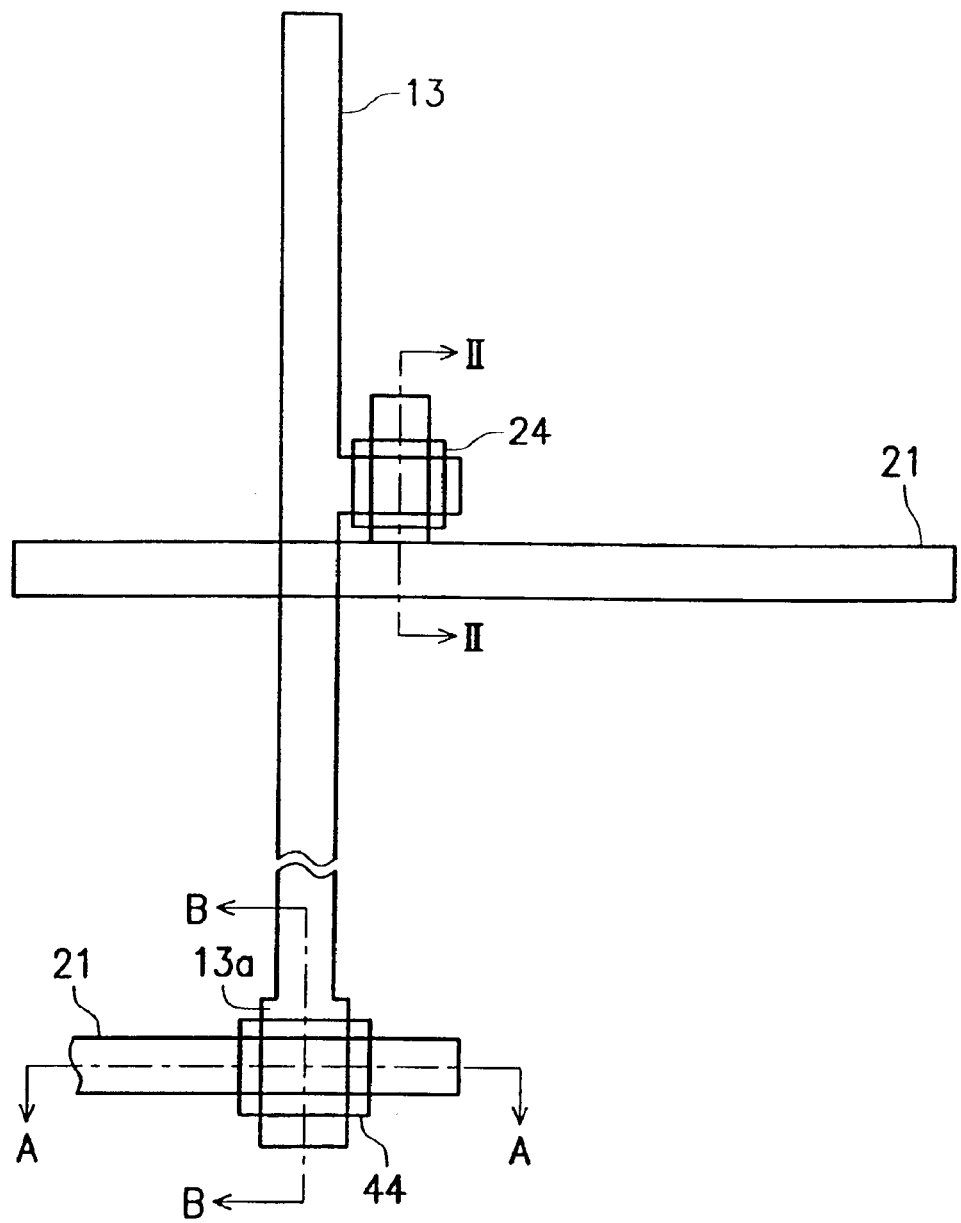
FIGS. 3 and 4 are layouts of the active matrix substrate showing the manufacturing steps in fabricating an active matrix substrate for a liquid crystal display in accordance with another embodiment of the present invention.
Figure 5A:
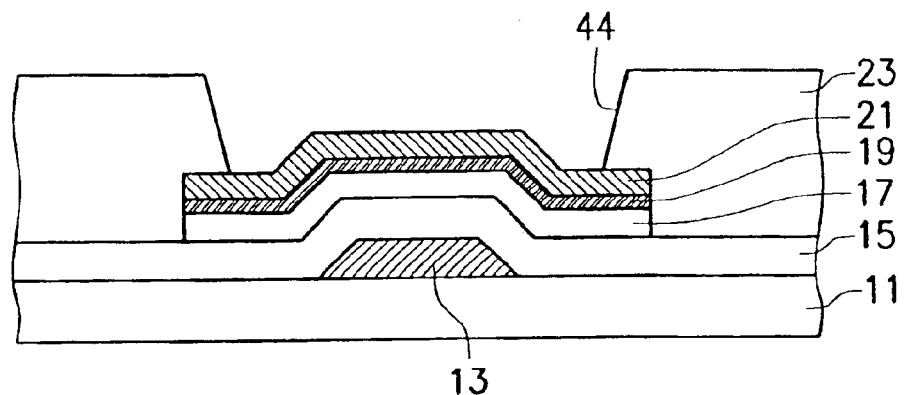
FIGS. 5A and 5B are cross sections taken along A—A and B—B lines in FIG. 3.
Figure 5B:
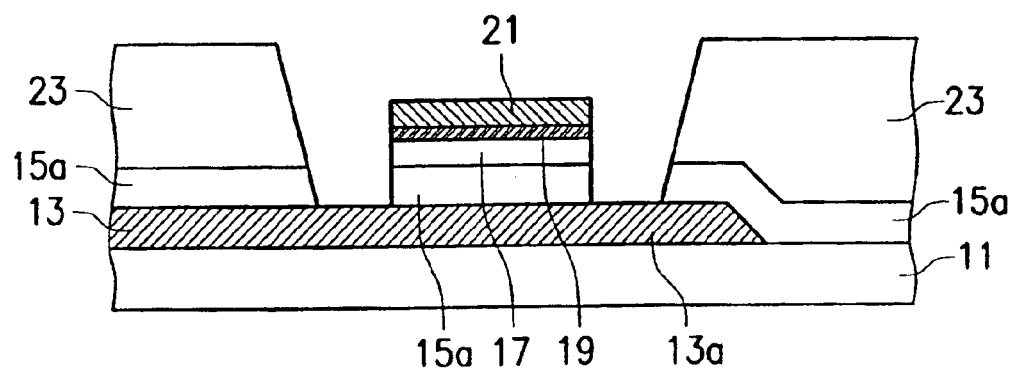

Referring to FIGS. 3, 5A and 5B, while the openings 24 are formed in the low k dielectric layer 23 in the active device regions A, as shown in FIGS. 1C and 2C, openings 44 are formed in the low k dielectric layer 23 and the gate insulating layer 15 on the bonding pads 13a located at the terminal of the gate lines 13. The gate insulating layer 15 are then transferred into the patterned gate insulating layer 15c, as shown in FIGS. 5A and 5B.

Figure 4:
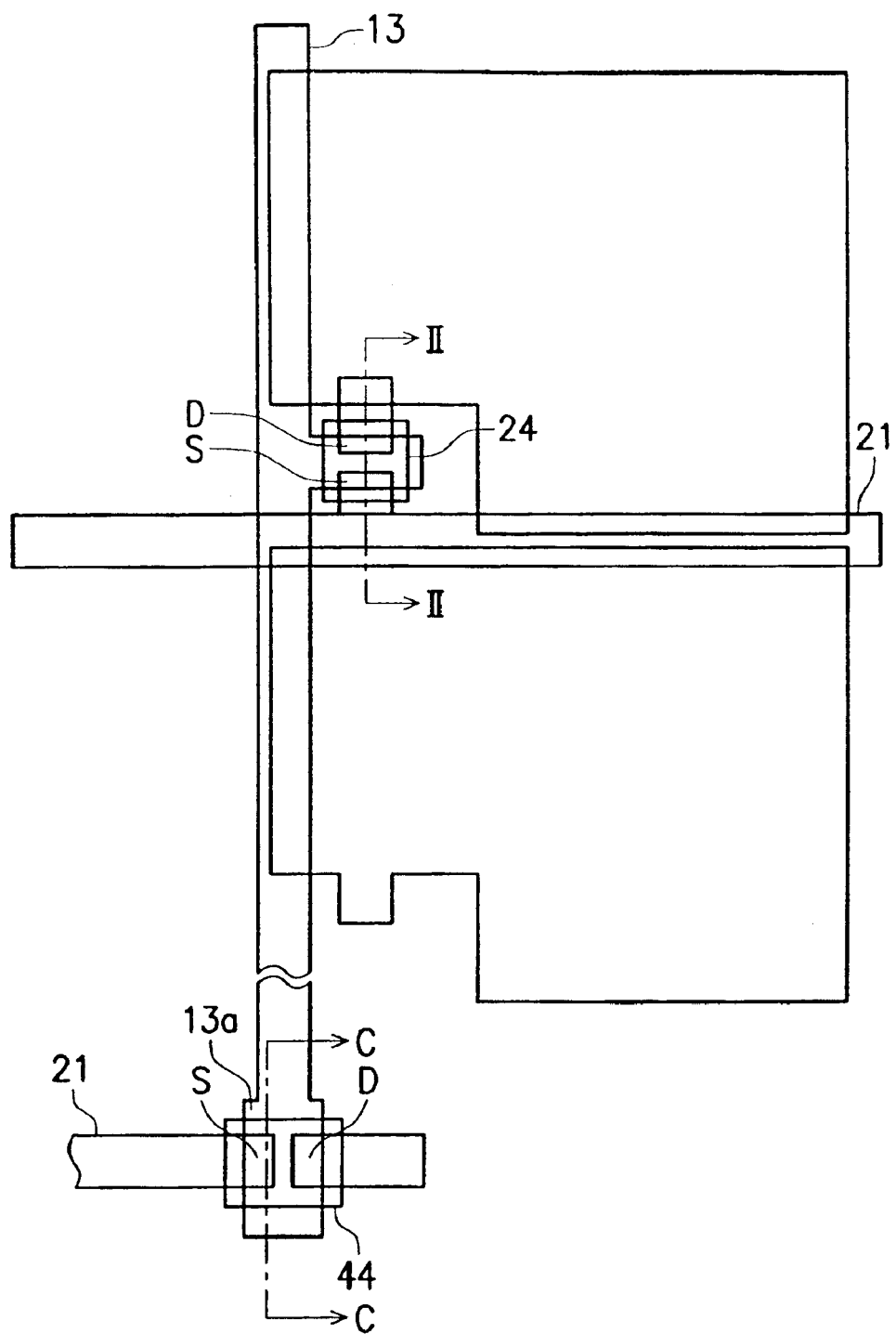
Figure 6:
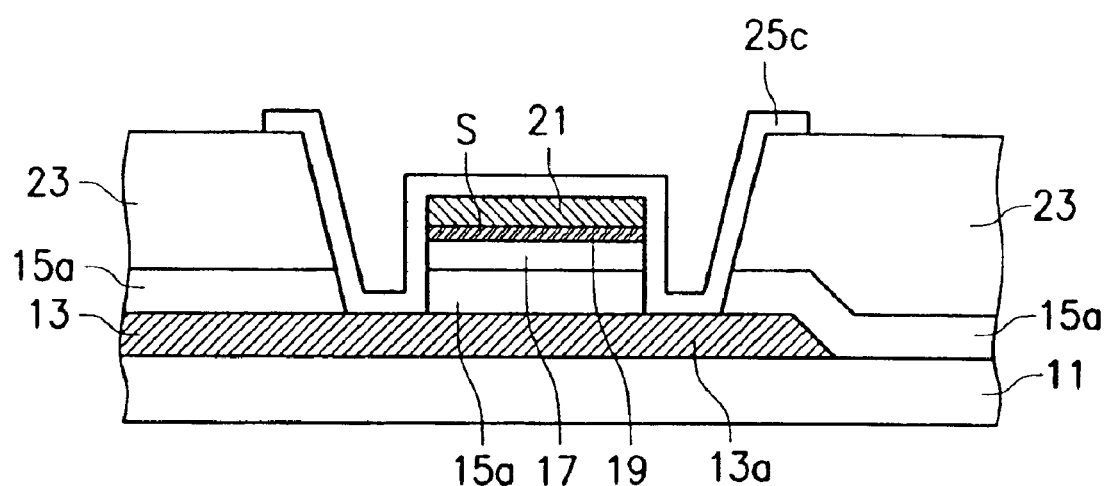
FIG. 6 is a cross section taken along C—C line in FIG. 4.

Referring to FIGS. 4 and 6, while the transparent conducting layer formed on the low k dielectric layer 23 is patterned into the pixel electrodes 25a and the conducting lines 25b with source patterns, as shown in FIGS. 1D and 2D, conducting lines 25c are formed to connect the bonding pads 13a and the sources S. After etching the transparent conducting layer, the etching process continues with the data lines 21 and the n-doped layer 19, therefore, openings 24 and 44 are formed in the transparent conducting layer, the date lines 21 and the n-doped layer 19 to define the sources S and the drains D. Each conducting line 25c is formed in the opening 44 to connect the bonding pad 13a and the corresponding source S, which constitutes a diode for ESD protection circuit.

The following processes of fabricating the active matrix substrate as mentioned in first embodiment follow.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of fabricating an active matrix substrate for a liquid crystal display, comprising:

providing a transparent substrate;

forming a plurality of gate lines on the transparent substrate, parallel to a first direction and having a plurality of protruding portions covering a plurality of active device regions;

forming a gate insulating layer on the gate lines and the transparent substrate;

forming a semiconductor layer on the gate insulating layer;

forming a n-doped layer on the semiconductor layer;

forming a metal layer on the n-doped layer;

patterning the semiconductor layer, the n-doped layer and the metal layer to transfer the metal layer to a plurality of data lines perpendicular to the first direction;

forming a low k dielectric layer on the data lines and the transparent substrate;

forming a plurality of first openings in the low k dielectric layer corresponding to the active device regions;

forming a transparent conducting layer on the low k dielectric layer;

patterning the low k dielectric layer to form a plurality of pixel electrodes and a plurality of first conducting lines with source pattern;

etching the data lines and the n-doped layer in the first openings, wherein the data lines and the n-doped layer have the same local pattern as the pixel electrodes and the first conducting lines in the first openings; and forming a passivating layer on the first openings.

2. The method of claim 1, where in the low k dielectric layer includes benzocyclobutene (BCB).

3. The method of claim 1, wherein in the step of patterning the semiconductor layer, the n-doped layer and the metal layer, further comprises patterning the gate insulating layer until exposing the transparent substrate at the same time.

4. The method of claim 1, wherein the pixel electrodes extend to regions under parts of the gate lines and over parts of data lines.

5. The method of claim 1, wherein the pixel electrodes and the first conducting lines include indium tin oxide (ITO).

6. The method of claim 1, wherein the pixel electrodes and the passivating layer include silicon nitride.

7. The method of claim 1, wherein a plurality of bonding pads are located at the terminal of the gate lines, a plurality of second openings corresponding to the active device regions and the bonding pads are formed in the low dielectric layer, and a plurality of second conducting lines corresponding to the second openings and the bonding pads connecting the corresponding sources and the bonding pads.

* * * * *